United States Patent
Chang et al.

(10) Patent No.: US 6,723,654 B2
(45) Date of Patent: Apr. 20, 2004

(54) METHOD AND APPARATUS FOR IN-SITU DESCUM/HOT BAKE/DRY ETCH PHOTORESIST/POLYIMIDE LAYER

(75) Inventors: Kuei-Jen Chang, Hsin-Chu (TW); Yuan-Ko Hwang, Huilan (TW); Juei-Wen Lin, Tai-Chung (TW); Jen-Yung Tseng, Tai-Ton (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 107 days.

(21) Appl. No.: 09/822,749

(22) Filed: Mar. 30, 2001

(65) Prior Publication Data

US 2002/0139775 A1 Oct. 3, 2002

(51) Int. Cl.[7] .................. H01L 21/461; C03C 15/00
(52) U.S. Cl. .......................... 438/725; 216/67
(58) Field of Search ................. 438/715, 723, 438/725, 907, 963; 216/67; 134/1.2, 1.3

(56) References Cited

U.S. PATENT DOCUMENTS 5,171,393 A * 12/1992 Moffat ................. 156/345.32
5,888,414 A * 3/1999 Collins et al. ......... 156/345.48

* cited by examiner

Primary Examiner—Luz Alejandro-Mulero
(74) Attorney, Agent, or Firm—Tung & Associates

(57) ABSTRACT

A method for in-situ descum/hot bake/dry etch a polyimide photoresist layer and a passivation layer in a singe process chamber is disclosed. A process chamber that can be used for conducting in-situ a descum, a hot bake and a dry etch process sequentially in the same chamber is also disclosed. In the method, a process chamber equipped with a wafer platform and a wafer backside heating and cooling device is first provided, followed by the step of positioning a wafer that has a passivation layer and a patterned polyimide photoresist layer on top of the platform. An oxygen plasma is then generated in the chamber cavity to conduct a descum process, followed by flowing a heated inert gas onto a backside of the wafer to conduct a hot bake process. A cooling inert gas is then flown onto the wafer backside and an etchant gas is flown into the chamber to conduct a dry etch process for forming a via opening in the wafer.

10 Claims, 2 Drawing Sheets

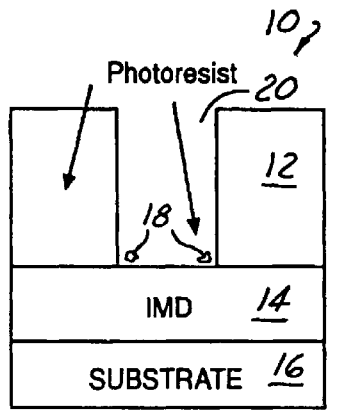
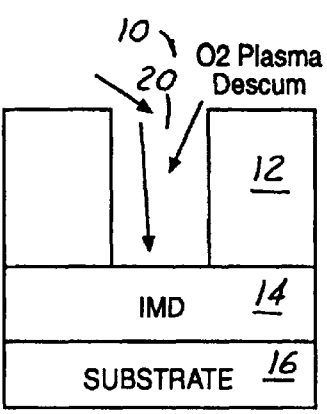
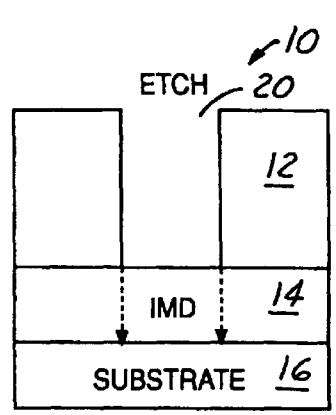
(PRIOR ART)
FIG. 1A
(PRIOR ART)
FIG. 1B
(PRIOR ART)
FIG. 1C
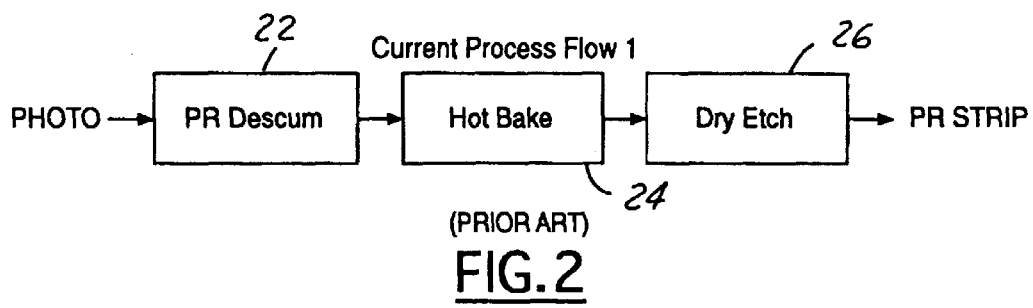
(PRIOR ART)
FIG. 2
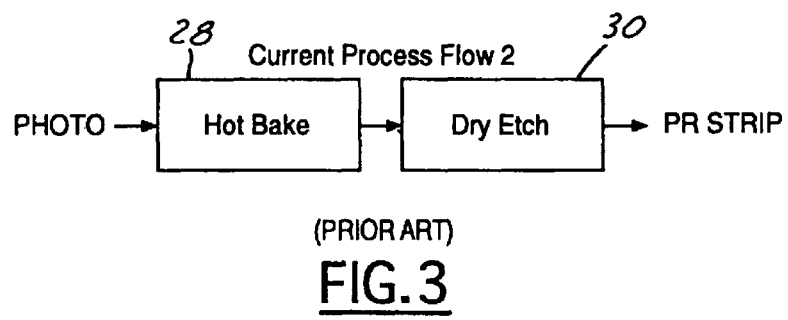
(PRIOR ART)
FIG. 3

METHOD AND APPARATUS FOR IN-SITU DESCUM/HOT BAKE/DRY ETCH PHOTORESIST/POLYIMIDE LAYER

FIELD OF THE INVENTION

The present invention generally relates to a method and apparatus for forming via holes in a photoresist and a passivation layer on a semiconductor structure and more particularly, relates to a method and apparatus for in-situ descum/hot bake/dry etch via holes in a photoresist and a passivation layer on top of a semiconductor structure.

BACKGROUND OF THE INVENTION

In the fabrication of modern semiconductor devices, via holes and trench openings are frequently formed in insulating material layers for providing electrical communication between various devices formed on a substrate. The formation of such via holes or trench openings include the steps of patterning by using a mask, photolithograph for reproducing the pattern, and various etching techniques for forming the openings in the insulating material layer.

In modern photolithography, a photosensitive polyimide material is frequently used as the photoresist layer due to its availability, cost, and easy processing characteristics. Since polyimide is an insulating material with an acceptable dielectric constant, polyimide affords the additional processing flexibility of being left in the semiconductor structure without being removed. This presents another processing advantage in that a photoresist removal step can be saved.

When a polyimide layer is patterned for etching the underlying passivation layer, a pre-treatment process of the polyimide layer by using oxygen plasma is normally required before a dry etching step. The purpose of the oxygen treatment process is to remove any residual, undeveloped polyimide material, or commonly known as polyimide or photoresist scum. The presence of the photoresist or polyimide scum could induce poor pattern transfer from the photoresist to the etched layer. The pre-treatment process is necessary in most via hole and trench opening formation process, and is particularly needed in a via dry etching process and a polyimide passivation etching process.

Conventionally, the oxygen plasma descum process is carried out in two separate process chambers, i.e. a descum process in the first chamber and a hot bake process in the second chamber. The processes therefore increase the product cycle time resulting in a waste of machine capacity. This is shown in FIGS. 1A–1C. On a conventional semiconductor structure 10, a polyimide photoresist layer 12 is deposited on an inter-metal-dielectric (IMD) layer 14 and a substrate 16 and is patterned by an imaging and developing process. Undeveloped photoresist material, or polyimide scum 18 may be left at the bottom of the photoresist opening 20 formed. FIG. 1B illustrates an oxygen plasma descum process in which oxygen plasma ions are bombarded into the photoresist opening 20 for oxidizing the polyimide scum 18. After the descum process is completed, as shown in FIG. 1C, a dry etch step can be carried out to form a via opening in the IMD layer 14.

The conventional process flow for either a via etch process or a polyimide passivation etch process can be shown in FIGS. 2 and 3. FIG. 2 illustrates a process flow for a conventional via etch process wherein a photoresist layer is first descumed in Step 22 after patterning to remove all residual, undeveloped photoresist material. The semiconductor structure is then hot baked, typically on a hot plate for a specific length of time to drive out residual moisture or solvent from the photoresist layer and the passivation layer. This is shown in Step 24. After a successful hot bake process is conducted, a via hole can be formed by a dry etch Step 26 before the photoresist layer is stripped away.

In a conventional process for polyimide passivation etch, as shown in FIG. 3, the photoresist layer is first hot baked in Step 28, typically on a hotplate, and then dry etched in Step 30, typically by a plasma etching or reactive ion etching technique before the photoresist layer is stripped. The conventional via forming process, as shown in FIG. 2, therefore requires three separate steps which must be run in three different process chambers and therefore, is a high cost fabrication process. In the polyimide passivation etch process, two separate steps are required which must be carried out in two different process chambers. Moreover, when a hot bake process is necessary, as shown in either FIG. 2 or FIG. 3, the semiconductor structure must be processed in a hotplate apparatus for driving away the moisture content or the residual solvent content in the structure. After a hot bake process, the wafer may be left in the atmosphere for some time to wait for the subsequent etching process. This waiting time, or commonly known as Q-time, must be relatively short. Otherwise, the photoresist layer must again be hot baked due to the absorption of environmental moisture.

It is therefore an object of the present invention to provide an in-situ descum/hot bake/dry etch process for a polyimide photoresist layer that does not have the drawbacks or shortcomings of the conventional methods.

It is another object of the present invention to provide a method for in-situ descum/hot bake/dry etch a polyimide photoresist layer in a single process chamber without the need of three process chambers.

It is a further object of the present invention to provide a method for in-situ hot bake/dry etch polyimide and passivation layers in a single process chamber without the need of two separate process chambers.

It is still another object of the present invention to provide a method for in-situ hot bake/dry etch a metal layer in a single process machine without the need of two separate process machines.

It is still another object of the present invention to provide a method for in-situ descum/hot bake/dry etch a polyimide photoresist layer and a passivation layer in a single process chamber by generating an oxygen plasma for the descum process, flowing a heated inert gas onto a wafer backside for the hot back process, and flowing a cooling inert gas onto the wafer backside for the dry etch process.

It is yet another object of the present invention to provide a process chamber for conducting in-situ, a descum, a hot bake, and a dry etch process sequentially in the same process chamber.

It is still another further object of the present invention to provide a process chamber for conducting in-situ a descum, a hot bake and a dry etch process that is equipped with a cooling means for flowing a cooled fluid onto a wafer backside and a heating means for flowing a heated fluid onto the wafer backside.

It is yet another further object of the present invention to provide a process chamber for conducting in-situ a descum, a hot bake and a dry etch process sequentially in the same chamber that is equipped with a plasma generating means for both the descum and the dry etch process.

SUMMARY OF THE INVENTION

In accordance with the present invention, a method and an apparatus for in-situ descum/hot bake/dry etch a polyimide photoresist layer and a passivation layer in a single process chamber are provided.

In a preferred embodiment, a method for in-situ descum/hot bake/dry etch a polyimide photoresist layer and a passivation layer in a single process chamber can be carried out by the steps of providing a process chamber that is equipped with a wafer platform and a wafer backside heating and cooling device; positioning a wafer that has a passivation layer and a patterned polyimide photoresist layer on top of the wafer platform; generating an oxygen plasma in the chamber conducting a descum process; flowing a heated inert gas onto a backside of the wafer conducting a hot bake process; and flowing a cooling inert gas onto the wafer backside conducting a dry etch process for forming a via opening in the wafer.

The method for in-situ descum/hot bake/dry etch a polyimide, photoresist layer and a passivation layer in a single process chamber may further include the step of conducting the descum process for a time period of less than 30 sec., or the step of conducting the hot bake process for a time period of at least 20 sec. The method may further include a step of conducting the hot bake process by flowing a heated He gas onto the backside of the wafer, or the step of flowing a heated He gas onto the wafer backside at a pressure of at least 10 mTorr, or the step of conducting the dry etch process for a time period of at least 1 min., or the step of conducting the dry etch process while flowing a cooling inert gas of He at a pressure of at least 10 mTorr. The method may further include the step of conducting the descum process at a chamber pressure of less than 1500 mTorr and at a plasma power of less than 150 W, or a $NO_2$ flow rate of less than 40 sccm and an inert gas flow rate of less than 400 sccm. The method may further include the step of providing the process chamber with a plasma generating means.

The present invention is further directed to a process chamber for conducting in-situ a descum, a hot bake and a dry etch process sequentially in the same chamber which includes a chamber cavity capable of being evacuated to a pressure of not higher than 1 Torr; a wafer platform for holding a wafer thereon; a plasma generating means for generating a plasma inside the chamber cavity; a gas inlet for flowing a reactant gas into the chamber cavity; a cooling means for flowing a cooled fluid onto a backside of the wafer; and a heating means for flowing a heated fluid onto the backside of the wafer.

The present invention is further directed to a process chamber for conducting in-situ a descum, a hot bake and a dry etch process sequentially in the same chamber. The wafer platform may be an electrostatic chucking device. The plasma generating means may be an $O_2$ plasma generating means, or a plasma etching means. The cooling means flows a cooled inert gas onto a backside of the wafer, or a cooled He gas onto the backside of the wafer. The heating means flows a heated He gas onto the backside of the wafer. The chamber may further include a fluid outlet conduit for flowing the cooled or the heated fluid away from the backside of the wafer.

BRIEF DESCRIPTION OF THE DRAWINGS

These and other objects, features and advantages of the present invention will become apparent from the following detailed description and the appended drawings in which:

FIGS. 1A–1C are enlarged, cross-sectional views of a conventional semiconductor structure being processed in a photoresist opening step, an $O_2$ plasma descum step and a dry etch step, respectively.

FIG. 2 is a process flow diagram illustrating a conventional via opening etching process.

FIG. 3 is a process flow diagram illustrating a conventional polyimide passivation dry etching process.

DETAILED DESCRIPTION OF THE PREFERRED EMBODIMENT

Figure 4:
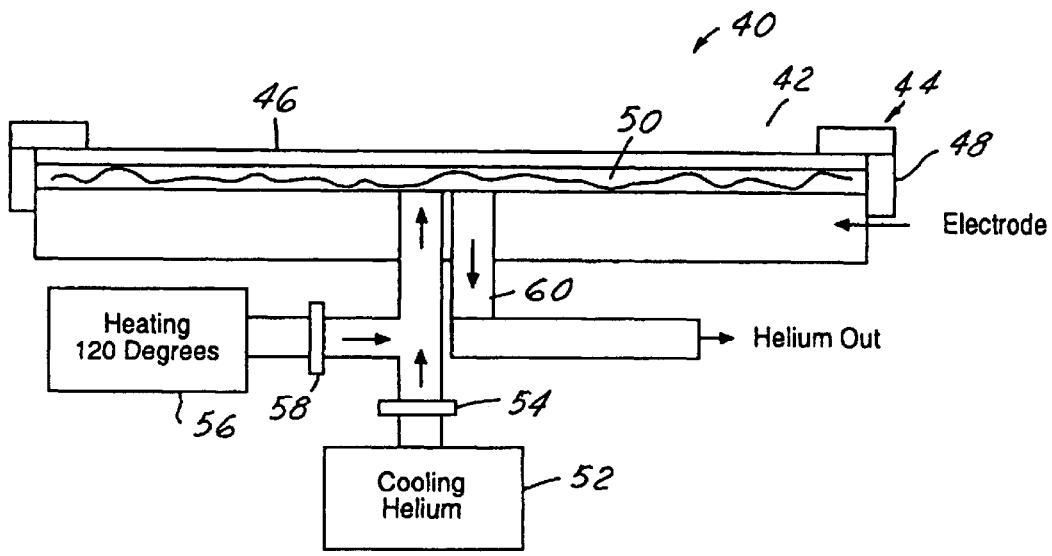
FIG. 4 is a cross-sectional view of a present invention apparatus for the in-situ descum/hot bake/dry etch a polyimide photoresist layer and a passivation layer in a single process chamber.

The present invention discloses a method for the in-situ descum/hot bake/dry etch process of a polyimide photoresist layer and a passivation layer conducted in a single process chamber. The invention further discloses an apparatus for conducting in-situ a descum, a hot bake and a dry etch process sequentially in the same chamber.

The process can be carried out by first providing a process chamber that is equipped with a wafer platform and a wafer backside heating and cooling device, followed by loading a wafer that has a passivation and a patterned polyimide photoresist layer on top of the wafer platform. An oxygen plasma is then generated in the process chamber to conduct a descum process by removing all undeveloped photoresist material, most likely from the bottom of the photoresist opening formed. A heated inert gas is then flown onto a backside of the wafer to conduct a hot bake process, followed by flowing a cooling inert gas onto the wafer backside and an etchant into the chamber cavity to conduct a dry etch process and to form a via opening on the wafer.

The present invention novel process chamber for conducting in-situ a descum, a hot bake and a dry etch process, sequentially can be constructed including a chamber cavity that is capable of being evacuated to a pressure not higher than 1 Torr, a wafer platform such as an electrostatic chuck for holding a wafer thereon; a plasma generating means for generating an oxygen plasma or an etchant plasma inside the chamber cavity; a gas inlet for flowing at least one reactant gas into the cavity; a cooling means for flowing a cooled gas onto the backside of the wafer; and a heating means for flowing a heated fluid onto the backside of the wafer.

The present invention utilizes an in-situ oxygen plasma descum method and a real-time hot bake process to reduce the via etch process cycle time so that the descum process and the hot bake process are combined into the via oxide etching recipe. For the polyimide etching process, a pad descum process is also merged with the passivation etching step such that the use of a separate process chamber can be avoided. Based on the experimental data obtained on the via profile obtained, on the resistance of the via and the yield data, the present invention novel method produces a similar result as the conventional process without the need for three separate process chambers.

The present invention method for in-situ oxygen plasma polyimide photoresist descum treatment and a real-time hot bake process can be carried out by first utilizing an oxygen plasma treatment to execute an in-situ descum and ashing process instead of in separate descum and ashing chambers immediately before the main ashing process is to commence. The method further utilizes a hot and cold backside gas system to execute in-situ hot bake process immediately after the in-situ descum process, if necessary, instead of a conventional hot bake process which must be executed off-line (in a hotplate apparatus) to improve the hot bake Q-time control. The present invention in-situ oxygen plasma treatment and hot backside gas system can be independently operated and thus, enables various processes to be carried out depending on the specific needs. For instance, for the formation of a via opening, the processes of in-situ $O_2$ descum+in-situ hot backside gas hot bake+via dry etching are required. For a polyimide dry etching, the process of in-situ $O_2$ descum+polyimide dry etching steps are required. For the metal etching, the process of in-situ hot backside gas hot bake+metal dry etching steps are required.

The present invention novel method utilizes in-situ descum process to improve the descum machine and ashing capacity; and also utilizes in-situ hot bake process to improve hotplate machine capacity and the Q-time issue.

Referring now to FIG. 4, wherein a cross-sectional view of the present invention apparatus 40 for the in-situ descum, hot bake and dry etch of a semiconductor structure in the same chamber is shown. The process chamber 40 consists of a chamber cavity 42 that is capable of being evacuated to a pressure of not higher than 1 Torr, a wafer platform 44 for holding a wafer 46 thereon and clamped by a wafer clamp 48. When an electrostatic chucking device (ESC) is utilized, the wafer clamp 48 is not necessary. The wafer platform 44 includes a wafer stage 50 which includes a multiplicity of apertures (not shown) in a top surface for flowing a wafer backside cooling or heating gas thereto. The process chamber 40 further includes a plasma generating means (not shown) that is used for generating a plasma inside the chamber cavity 42. The plasma generated can be either an oxygen plasma for use in the descum process, or an etching gas plasma for use in the dry etch process.

The process chamber 40 further includes a gas inlet (not shown) for flowing a reacting gas into the chamber cavity, a cooling means 52 and a valve 54 for flowing and controlling a cooled fluid, i.e. a cooled inert gas, onto a backside of the wafer 46. The process chamber further includes a heating means 56 and a valve 58 for flowing and controlling a heated fluid onto the backside of the wafer 46. A fluid outlet conduit 60 is further included for flowing the cooled or heated fluid away from the backside of the wafer.

Figure 5:
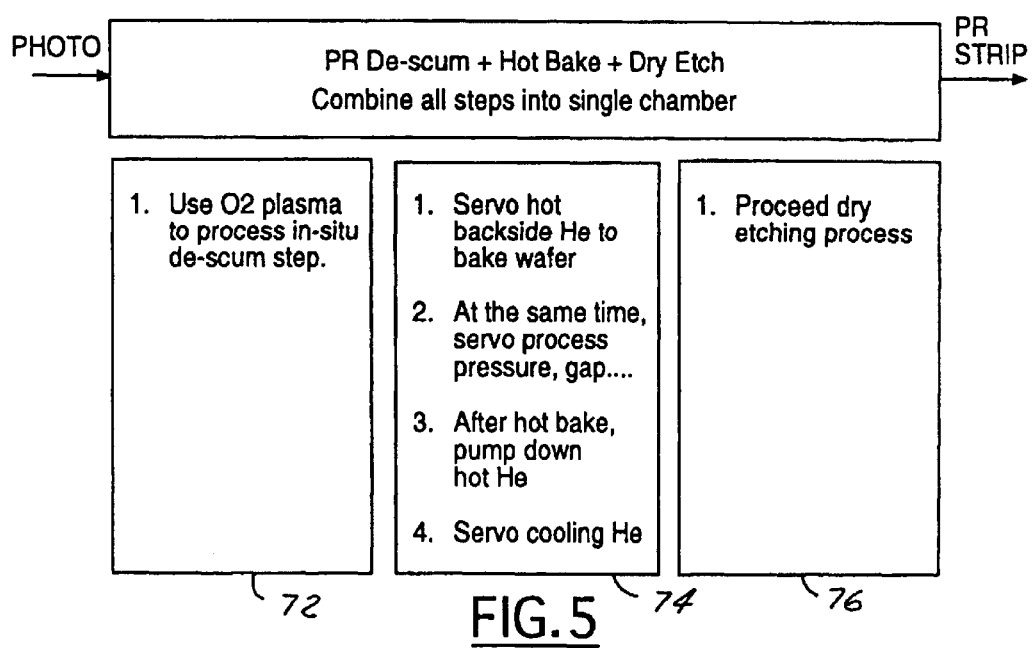
FIG. 5 is a process flow diagram illustrating the present invention single chamber descum/hot bake/dry etch process.

Referring now to FIG. 5, wherein a present invention process flow chart 70 is shown. The present invention novel process incorporates the execution of a photoresist descum step, a hot bake step and a dry etch step into a single chamber. As shown in step 72, an oxygen plasma is first used to process an in-situ descum step for removing undeveloped or unreacted photoresist material from a bottom of the opening formed in the photoresist layer. The descum process normally takes a time period less than 30 sec. In a preferred embodiment, the descum process only requires a time period of about 10 sec. The word "about" used in this writing indicates a range of value that is ±10% from the average value given.

In the next step 74 of the process, a hot backside inert gas such as He is flown onto the wafer backside at a pressure of at least 10 mToor, and preferably at least 20 mTorr for a time period of at least 20 sec., and preferably at least 30 sec. During the hot bake process, the chamber pressure is kept at about 300 mTorr with a gap of about 1.5 cm. After the hot bake period is completed, the hot He gas is pumped down and then, a cooling inert gas such as He is flown onto the backside of the wafer. This is shown as step 76 in FIG. 5 for the execution of the dry etching step. The dry etching step is carried out normally for a time period of at least 1 min., and preferably for a time period at least 2 min.

During the descum step, the descum process can be carried out at a chamber pressure of less than 1500 mTorr and at a plasma power of less than 150 W, at an oxygen flow rate of less than 40 sccm, and at an inert gas flow rate of less than 400 sccm. By utilizing the present invention novel method of conducting the three separate processes in the same process chamber, the cycle time reduction achieved from a conventional method which requires between 3.5~4.0 hours down to a short cycle term of only 1.5 hour for a via forming process.

The present invention novel method and apparatus for the in-situ descum/hot bake/dry etch a polyimide photoresist layer and a passivation layer in a singer process chamber has therefore been amply described in the above description and in the appended drawings of FIGS. 4 and 5.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for in-situ descum/hot bake/dry etch a polyimide photoresist layer in a single process chamber comprising the steps of:

providing a process chamber equipped with a wafer platform and a wafer backside heating and cooling device;

positioning a wafer having a passivation layer and a patterned polyimide photoresist layer on top on said wafer platform;

generating an $O_2$ plasma in said chamber for conducting a descum process;

flowing a heated inert gas onto a backside of said wafer for conducting a hot bake process; and flowing a cooling inert gas onto said wafer backside and an etchant into said chamber for conducting a dry etch process for a via opening on said wafer.

2. The method for in-situ descum/hot bake/dry etch a polyimide photoresist layer in a single process chamber according to claim 1 further comprising the step of conducting said descum process for a time period of less than 30 sec.

3. The method for in-situ descum/hot bake/dry etch a polyimide photoresist layer in a single process chamber according to claim 1 further comprising the step of conducting said hot bake process for a time period of at least 20 sec.

4. The method for in-situ descum/hot bake/dry etch a polyimide photoresist layer in a single process chamber according to claim 1 further comprising the step of conducting said hot bake process by flowing a heated He gas onto said backside of the wafer.

5. The method for in-situ descum/hot bake/dry etch a polyimide photoresist layer in a single process chamber according to claim 1 further comprising the step of conducting said hot bake process by flowing a heated He gas onto said backside of the wafer at a pressure of at least 10 mTorr.

6. The method for in-situ descum/hot bake/dry etch a polyimide photoresist layer in a single process chamber according to claim 1 further comprising the step of conducting said dry etch process for a time period of at least 1 min.

7. The method for in-situ descum/hot bake/dry etch a polyimide photoresist layer in a single process chamber according to claim 1 further comprising the step of conducting said dry etch process while flowing cooling inert gas of He at a pressure of at least 10 m Torr.

8. The method for in-situ descum/hot bake/dry etch a polyimide photoresist layer in a single process chamber according to claim 1 further comprising the step of conducting said descum process at a chamber pressure of less than 1500 mTorr and a plasma power of less than 150 W.

9. The method for in-situ descum/hot bake/dry etch a polyimide photoresist layer in a single process chamber according to claim 1 further comprising the step of conducting said descum process at an $O_2$ flow rate of less than 40 sccm and an inert gas flow rate of less than 400 sccm.

10. The method for in-situ descum/hot bake/dry etch a polyimide photoresist layer in a single process chamber according to claim 1 further comprising the step of providing said process chamber with a plasma generating means.

* * * * *